(12) United States Patent
Bedell et al.

(10) Patent No.: US 9,698,039 B2
(45) Date of Patent: Jul. 4, 2017

(54) CONTROLLED SPALLING UTILIZING VAPORIZABLE RELEASE LAYERS

(71) Applicant: International Business Machines Corporation, Armonk, NY (US)

(72) Inventors: Stephen W. Bedell, Wappingers Falls, NY (US); Ning Li, White Plains, NY (US); Katherine L. Saenger, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/173,123

(22) Filed: Jun. 3, 2016

(65) Prior Publication Data
US 2017/0110359 A1    Apr. 20, 2017

Related U.S. Application Data

(63) Continuation of application No. 14/884,262, filed on Oct. 15, 2015, now Pat. No. 9,496,128.

(51) Int. Cl.
| | |
|---|---|
| *H01L 21/30* | (2006.01) |
| *H01L 21/46* | (2006.01) |
| *H01L 21/31* | (2006.01) |
| *H01L 21/469* | (2006.01) |
| *H01L 23/34* | (2006.01) |
| *H01L 21/683* | (2006.01) |
| *B05D 1/00* | (2006.01) |

(52) U.S. Cl.
CPC .......... *H01L 21/6835* (2013.01); *B05D 1/005* (2013.01); *H01L 2221/68381* (2013.01)

(58) Field of Classification Search
CPC ......... H01L 21/02005; H01L 21/67132; H01L 21/6835; H01L 2221/68318

USPC .................. 257/720; 438/458, 759
See application file for complete search history.

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |
| 6,887,770 | B2 | 5/2005 | Ueda et al. |
| 8,247,261 | B2 | 8/2012 | Bedell et al. |
| 8,334,152 | B2 | 12/2012 | Speier |
| 8,709,914 | B2 | 4/2014 | Bedell et al. |
| 8,936,961 | B2 | 1/2015 | Bedell et al. |

(Continued)

FOREIGN PATENT DOCUMENTS

| | | |
|---|---|---|
| JP | 200784707 A | 4/2007 |
| JP | 2008109105 A | 5/2008 |

(Continued)

OTHER PUBLICATIONS

English translation for Japanese Application No. JP2014211638A.

(Continued)

*Primary Examiner* — David S Blum
(74) *Attorney, Agent, or Firm* — Louis J. Percello; Ryan, Mason & Lewis, LLP (57) ABSTRACT

Method for a controlled spalling utilizing vaporizable release layers. For example, a method comprises providing a base substrate, depositing a stressor layer and a vaporizable release layer on the base substrate, forming a flexible support layer on at least one of the stressor layer and the vaporizable release layer, spalling an upper portion of the base substrate, securing the spalled upper portion of the base substrate to a handle substrate, and vaporizing the vaporizable release layer.

17 Claims, 7 Drawing Sheets

(56) References Cited

U.S. PATENT DOCUMENTS

| | | | |
|---|---|---|---|
| 8,969,174 | B2 | 3/2015 | Bedell et al. |
| 2005/0170611 | A1 | 8/2005 | Ghyselen et al. |
| 2012/0309269 | A1 | 12/2012 | Khayyat et al. |
| 2015/0035173 | A1 | 2/2015 | Dang et al. |
| 2015/0035554 | A1 | 2/2015 | Dang et al. |
| 2015/0132924 | A1 | 5/2015 | Dang et al. |

FOREIGN PATENT DOCUMENTS

| | | |
|---|---|---|
| JP | 2013516767 A | 5/2013 |
| JP | 5288149 B2 | 9/2013 |
| JP | 5608694 B2 | 10/2014 |
| JP | 2014211638 A | 11/2014 |
| WO | 2015014265 A1 | 2/2015 |
| WO | 2015014266 A1 | 2/2015 |

OTHER PUBLICATIONS

English translation for Japanese Application No. JP5608694B2.
English translation for Japanese Application No. JP2007084707A.
S.W. Bedell et al., "Advanced Flexible Electronics: Challenges and Opportunities," Procedures of SPIE, Micro- and Nanotechnology Sensors, Systems, and Applications VI9083, Jun. 2014, 9 pages, vol. 9083.
S.W. Bedell et al., "Kerf-Less Removal of Si, Ge, and III-V Layers by Controlled Spalling to Enable Low-Cost PV Technologies," IEEE Journal of Photovoltaics, Apr. 2012, pp. 141-147, vol. 2, No. 2.
Promerus, "Application Areas," www.promerus.com/sacrificial_application.asp, 2008, 1 page.
List of IBM Patents or Patent Applications Treated as Releated.

CONTROLLED SPALLING UTILIZING VAPORIZABLE RELEASE LAYERS

REFERENCE TO RELATED APPLICATION

This application is a continuation application of U.S. patent application Ser. No. 14/884,262, filed Oct. 15, 2015, now U.S. Pat. No. 9,496,128, of which is incorporated by reference in its entirety.

BACKGROUND

Controlled spalling technology now makes it possible to remove ("spall") a thin (typically <100 micron or μm) substrate layer from the surface of a base substrate with near-zero thickness-direction kerf losses, and to do this multiple times on the same base substrate. The potential cost savings are enormous since (i) the thickness of the spalled substrate layer can be limited to the thickness needed for the intended devices and (ii) many substrate layers may be derived from a single wafer or ingot.

However, the fragility of the spalled substrate layers typically requires that they be supported by one or more handle substrates or flexible support layers for at least some stages of processing. A flexible support layer (e.g., some type of tape) is typically first bonded to the stressor layer side of a substrate wafer/stressor layer couple, leaving an overhang of tape which may be used to initiate spall. After spalling, an upper portion of the substrate and the stressor layer remain attached to the flexible support layer. After the desired processing is completed on the exposed (spalled) surface of the spalled layer, it is often desirable to mount the spalled layer on a permanent handle substrate and remove the flexible support layer.

SUMMARY

Embodiments provide methods and apparatus for a controlled spalling utilizing vaporizable release layers. For example, in one embodiment, a method comprises providing a base substrate, depositing a stressor layer and a vaporizable release layer on the base substrate, forming a flexible support layer on at least one of the stressor layer and the vaporizable release layer, spalling an upper portion of the base substrate, securing the spalled upper portion of the base substrate to a handle substrate and vaporizing the vaporizable release layer.

DETAILED DESCRIPTION

Embodiments will now be described in further detail with regard to controlled spalling techniques utilizing a vaporizable release layer. It is to be understood that various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any of the layers, structures, and regions not explicitly shown are omitted from the actual devices.

Furthermore, it is to be understood that embodiments discussed herein are not limited to the particular materials, features, and processing steps shown and described herein. In particular, with respect to formation (fabricating or processing) steps, it is to be emphasized that the descriptions provided herein are not intended to encompass all of the steps that may be used to form a functional integrated circuit device. Rather, certain steps that are commonly used in forming such devices, such as, for example, but not limited to, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example, 1% or less than the stated amount. Also, in the figures, the illustrated scale of one layer, structure, and/or region relative to another layer, structure, and/or region is not necessarily intended to represent actual scale.

It can be difficult to find a flexible support layer (or flexible support layer stack) that has all of the following properties: (i) thin and flexible enough not to interfere with the spalling process, (ii) adherent enough to remain bonded during the processing for which it should stay on, and (iii) detachable enough to be removed without damaging the spalled layer when the flexible support is no longer needed (e.g., after the spalled layer has been bonded to a handle substrate).

Three existing flexible support layers in use all have drawbacks. While thermal release tapes (e.g., Nitto Denko tapes comprising a polyester backing layer and a thermal release layer composed of an adhesive embedded with small particles that irreversibly expand upon heating) are releasable with near-zero force, existing formulations of these tapes have a thickness (typically 75 μm for the adhesive and 100 μm or more for the backing) and rigidity that reduces the effectiveness of the stressor layer and interferes with good spalling. UV-release tapes (comprising a backing layer and a UV-degradable adhesive) are thin enough not to interfere with spalling, but are still tacky after UV treatment and require a prohibitive amount of force to release. Various Kapton polyimide tapes have the desired flexibility and thermal stability, but are difficult to remove cleanly and selectively to underlying layers.

A number of different illustrative embodiments for improving a spalling process by utilizing vaporizable release layers will be described below with reference to FIGS. 1A through 4F. Each of the figures illustrate steps which may be used in the process of spalling a base substrate.

The term "vaporizable release layer" refers to a layer composed of materials that lose physical integrity upon heating. Vaporizable release layers are distinguished from above-mentioned thermal release layers in that thermal release layers typically contain microcapsules that expand upon heating whereas vaporizable release layers give off some type of gas. For example, a class of materials known as norbornenes (developed by BFGoodrich and marketed by Promerus under the trademarked name Unity®) provide for a suitable vaporizable release layer. Monomeric norbornene, for example, is a low molecular weight bridged cyclic hydrocarbon ($C_7H_{10}$) that can be functionalized and/or polymerized to form materials that cleanly decompose into high volatility products upon heating at temperatures in the range 200-300° C. The norbornene material can be used for temporary wafer bonding and can be applied using a standard spin coat process. A simple thermal process can be used to release the wafer leaving little material residue.

Embodiments of the present invention are however, not necessarily limited to using norbornenes as the vaporizable release layer, but rather, any class of suitable materials that lose physical integrity upon heating can be utilized for the methods and apparatus discussed herein. For example, metals with low melting points (In, Ga, Sn etc.), waxes, or any material that is adherent at deposition temperature and condition but non-adherent at elevated temperatures, may be utilized without departing from the scope or spirit of the invention.

Figure 1A:
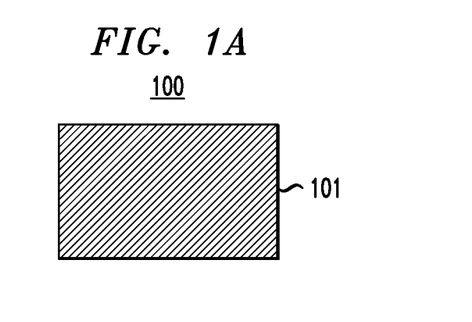
FIG. 1A illustrates a cross-sectional view of a structure comprising a base substrate to be spalled, according to an embodiment of the invention.
Figure 1B:
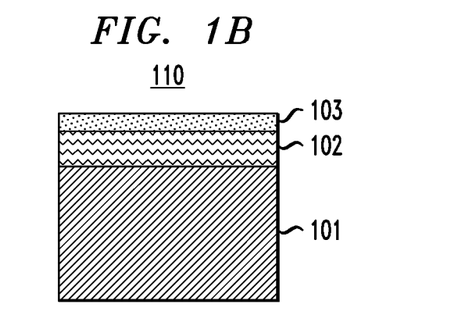
FIG. 1B illustrates a cross-sectional view of a structure comprising a base substrate, a stressor layer and a vaporizable release layer formed on top of the base substrate, according to an embodiment of the invention.
Figure 1C:
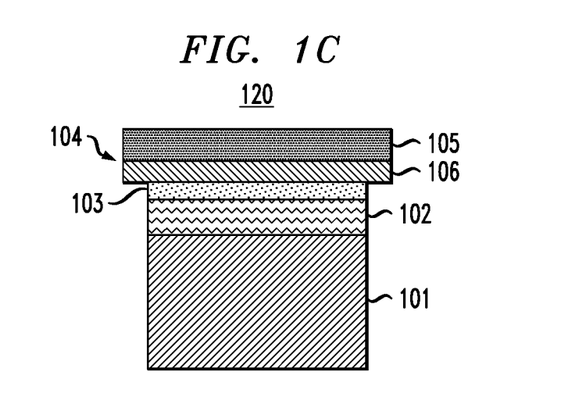
FIG. 1C illustrates a cross-sectional view of a structure comprising a base substrate, a stressor layer, a vaporizable release layer and a flexible handle formed on top of the vaporizable release layer, according to an embodiment of the invention.

Referring now to FIGS. 1A-1F, an embodiment for a controlled spalling process is illustrated wherein a base substrate is spalled, the spalled layer of the base substrate is transferred to a handle substrate and a flexible support layer is released by the vaporizable release layer. FIG. 1A illustrates a structure 100 comprising a base substrate 101. The base substrate 101 may be, but is not limited to, a semiconductor wafer or ingot comprising an inorganic single crystal or polycrystalline material such as Ge, Si, GaAs, sapphire, GaN or any solid brittle material. In FIG. 1B, a structure 110 comprises a stressor layer 102 and a vaporizable release layer 103 deposited onto the top surface of the base substrate 101. The stressor layer 102 may comprise, for example, Ni, Cr, Fe, and the like, and may additionally comprise other metals and alloys, such as Ti, to improve its adhesive properties. The vaporizable release layer 103 may comprise, for example, but not limited to, norbornene materials. In FIG. 1C, a structure 120 comprises the base substrate 101, the stressor layer 102, the vaporizable release layer 103 and a flexible support layer 104 comprising flexible support tape 105 and a tape adhesive 106 formed on top of the vaporizable release layer 103. The flexible support tape 105 may comprise, for example, a Kapton tape or a Vinyl tape.

Figure 1D:
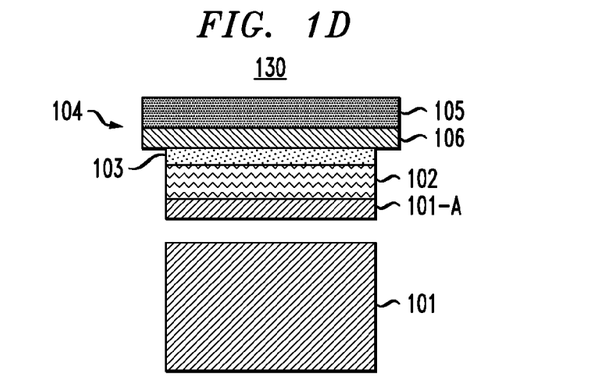
FIG. 1D illustrates a cross-sectional view of the structure in FIG. 1C after spalling of the base substrate, according to an embodiment of the invention.
Figure 1E:
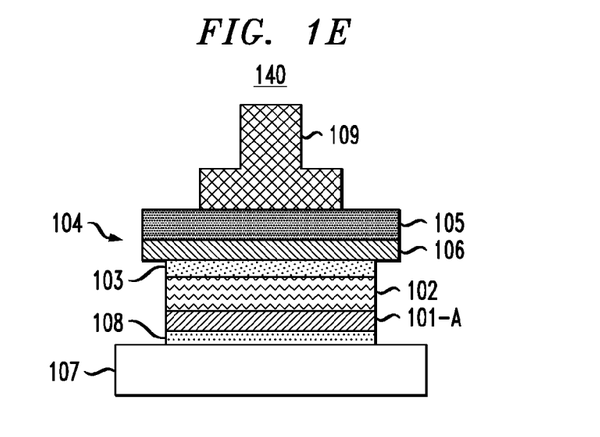
FIG. 1E illustrates a cross-sectional view of a structure comprising a spalled portion of a base substrate after being bonded to a handle substrate, according to an embodiment of the invention.
Figure 1F:
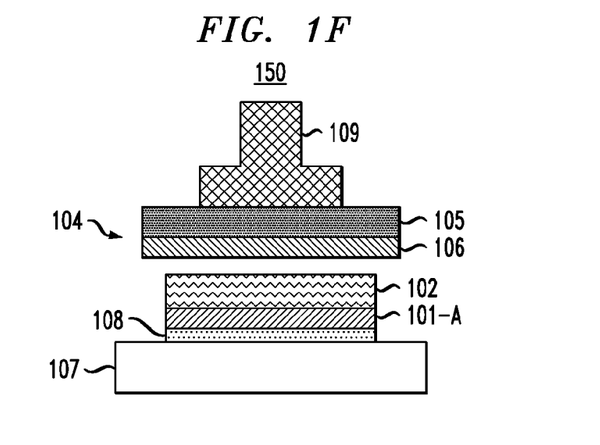
FIG. 1F illustrates a cross-sectional view of a structure after removal of a vaporizable release layer, according to an embodiment of the invention.

FIG. 1D illustrates a structure 130 wherein the base substrate 101 has been spalled leaving an upper spalled portion 101-A of the base substrate 101 attached to the stressor layer 102. The characteristics of the stressor layer 102, such as thickness and stress, and the flexible support layer 104 are adjusted to create a fracture in the base substrate 101 that ultimately separates the upper spalled portion 101-A from the base substrate 101. The remaining lower portion of the base substrate 101 may be, for example, utilized for further spalling or may be recycled for further processing. The upper spalled portion 101-A remains attached to the stressor layer 102, the vaporizable release layer 103 and the flexible support layer 104. FIG. 1E illustrates a structure 140 wherein the upper spalled portion 101-A, along with the stressor layer 102, the vaporizable release layer 103 and the flexible support layer 104, has been transferred to a handle substrate 107. An epoxy layer 108 is provided between the bottom surface of the upper spalled portion 101-A and the top surface of the handle substrate 107 in order to attach the upper spalled portion 101-A to the handle substrate 107, utilizing heated laminating force 109. Then, a simple thermal process is utilized to raise the temperature of the structure 140 to 200-300 degrees Celsius resulting in a structure 150 shown in FIG. 1F, whereupon the vaporizable release layer 103 has been vaporized releasing the flexible support layer 104 from the stressor layer 102. Lastly, the stressor layer 102 is etched away leaving only the thin spalled layer 101-A.

Figure 2A:
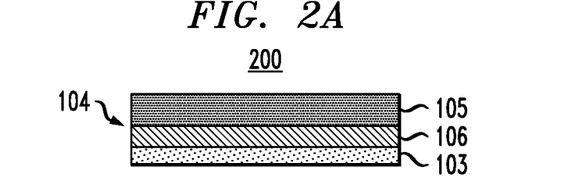
FIG. 2A shows a flexible support layer incorporating a vaporizable release layer, according to an embodiment of the invention.
Figure 2B:
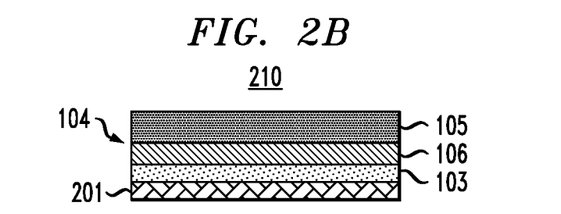
FIG. 2B shows a flexible support layer comprising a vaporizable release layer and additional adhesive tape, according to an embodiment of the invention.
Figure 2C:
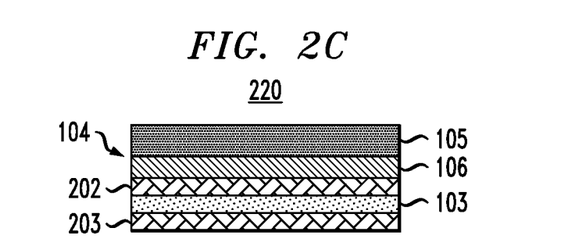
FIG. 2C shows a flexible support layer comprising a vaporizable release layer formed between two layers of adhesive tape, according to an embodiment of the invention.

In the above embodiment, for ease of processing, the vaporizable release layer 103 may be incorporated into the flexible support layer 104, as shown in FIG. 2A. The vaporizable release layer 103 may be pre-coated onto the flexible support layer 104 by including it as one or more layers of a multilayer flexible support structure. The vaporizable release layer 103 may be formed on surfaces by spinning or spraying from a solution. However, the vaporizable release layer 103 may not be sufficiently adhesive to bond to the stressor layer 102 (not shown in FIG. 2A). Therefore, any additional tape adhesive may be utilized to increase the bond strength between the vaporizable release layer 103 and the stressor layer 102, as shown in FIGS. 2B and 2C. In FIG. 2B, a layer of tape adhesive 201 is deposited below the vaporizable release layer 103. Alternatively, in FIG. 2C, the vaporizable release layer 103 is deposited between a first layer of tape adhesive 202 and a second layer of tape adhesive 203. In embodiments utilizing the additional tape adhesive as shown in FIGS. 2B and 2C, an adhesive residue may be left on the stressor layer 102 (not shown in FIG. 2B or 2C) after vaporizing the vaporizable release layer 103.

In another embodiment of the invention, a patterned layer of a photoimageable vaporizable release layer is used to define a stressor layer edge. This is typically used for edge exclusion to facilitate the spalling initiation. Stressor layer regions over the vaporizable release layer regions will debond from the substrate upon mild heating. FIGS. 3A-3E show the steps of this embodiment in more detail. After the stressor layer edge definition step, the process may continue on to the next steps, such as the processes shown in FIGS. 1B-1F.

Figure 3A:
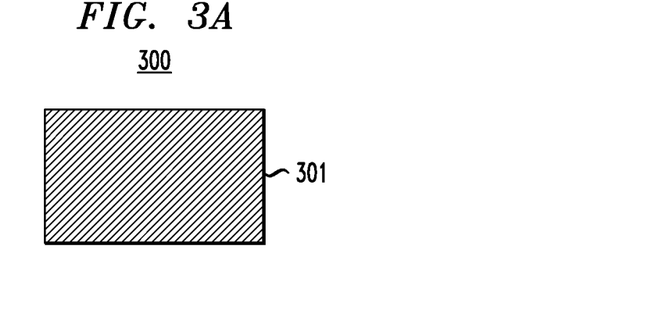
FIG. 3A illustrates a cross-sectional view of a structure comprising a base substrate to be spalled, according to an embodiment of the invention.
Figure 3B:
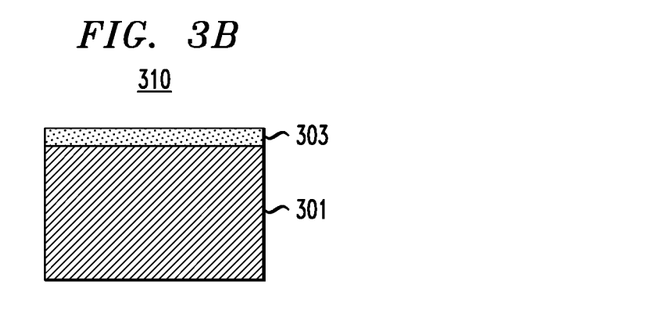
FIG. 3B illustrates a cross-sectional view of a structure comprising a base substrate and a vaporizable release layer formed on top of the base substrate, according to an embodiment of the invention.
Figure 3C:
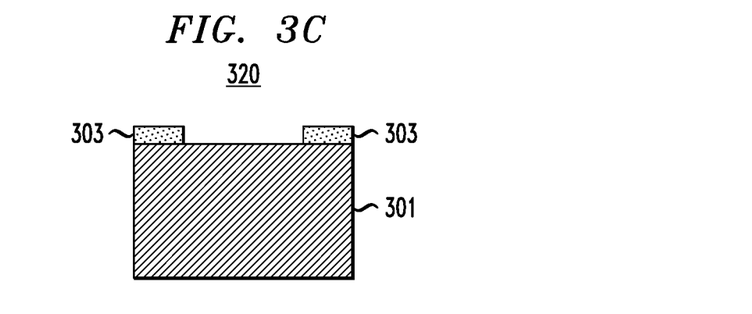
FIG. 3C illustrates a cross-sectional view of a structure comprising a vaporizable release layer patterned to define a stressor layer edge, according to an embodiment of the invention.
Figure 3D:
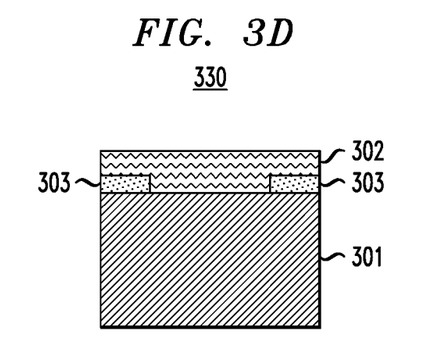
FIG. 3D illustrates the cross-sectional view of the structure in FIG. 3C after deposition of a stressor layer, according to an embodiment of the invention.
Figure 3E:
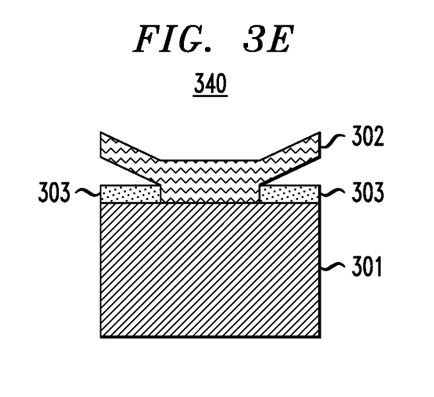
FIG. 3E illustrates the cross-sectional view of a structure showing a stressor layer over a vaporizable release layer debonding after mild heating, according to an embodiment of the invention.

FIG. 3A illustrates a structure 300 comprising a base substrate 301. In FIG. 3B, a structure 310 shows a vaporizable release layer 303 deposited onto the top surface of the base substrate 301. In FIG. 3C, a structure 320 shows the vaporizable release layer 303 patterned to define a stressor layer edge. In FIG. 3D, a structure 330 shows a stressor layer 302 deposited on the base substrate 301 and on the vaporizable release layer 303 patterned to define the stressor layer edge. After applying mild heating (preferably a temperature ranging from 50 degrees Celsius to 400 degrees Celsius), the stressor layer 302 debonds from the vaporizable release layer 303 defining the stressor layer edge, as shown in structure 340 in FIG. 3E. Thereafter, the structure 340 may further be processed for controlled spalling via steps discussed with references to FIGS. 1B-1F (i.e., depositing a layer of a vaporizable release layer, depositing the flexible support layer, etc.).

In yet another embodiment of the invention, a vaporizable release layer is used to remove a stressor layer from a spalled layer of a base substrate. FIGS. 4A-4F illustrate a controlled spalling process wherein a base substrate is spalled, the spalled layer of the base substrate is transferred to a handle substrate and a stressor layer is released by a vaporizable release layer.

Figure 4A:
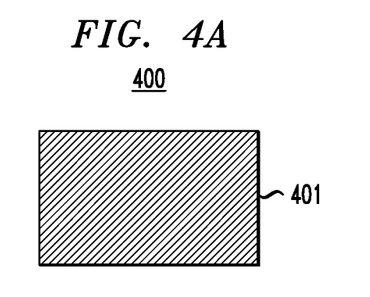
FIG. 4A illustrates a cross-sectional view of a structure comprising a base substrate to be spalled, according to an embodiment of the invention.
Figure 4B:
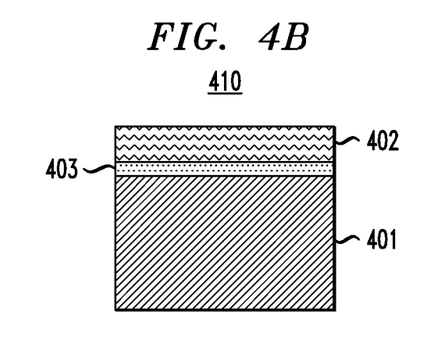
FIG. 4B illustrates a cross-sectional view of a structure comprising a base substrate, a vaporizable release layer and a stressor layer formed on top of the base substrate, according to an embodiment of the invention.
Figure 4C:
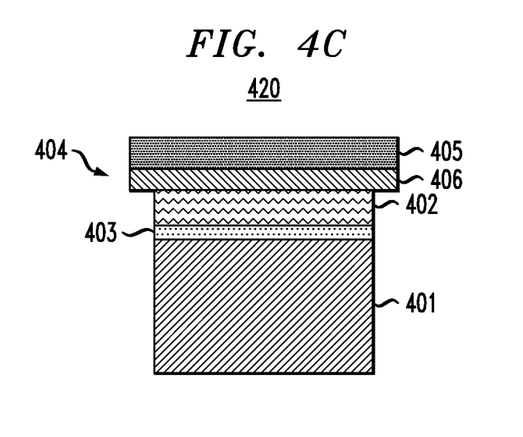
FIG. 4C illustrates a cross-sectional view of a structure comprising a base substrate, a vaporizable release layer, a stressor layer and a flexible handle formed on top of the vaporizable release layer, according to an embodiment of the invention.
Figure 4D:
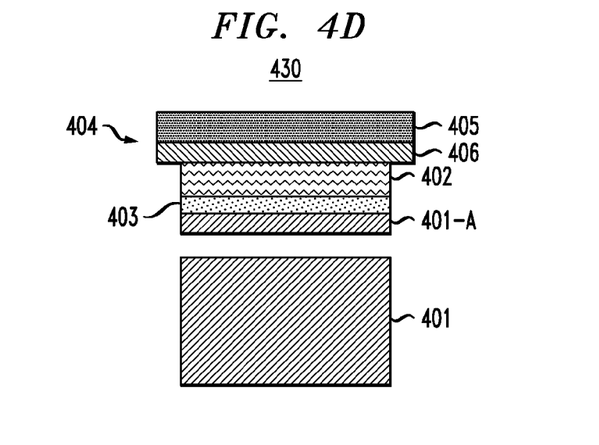
FIG. 4D illustrates a cross-sectional view of the structure in FIG. 4C after spalling of the base substrate, according to an embodiment of the invention.
Figure 4E:
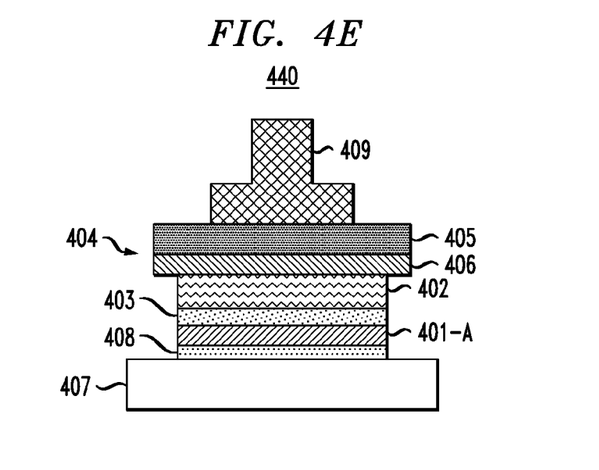
FIG. 4E illustrates a cross-sectional view of a structure comprising a spalled portion of a base substrate after being bonded to a handle substrate, according to an embodiment of the invention.
Figure 4F:
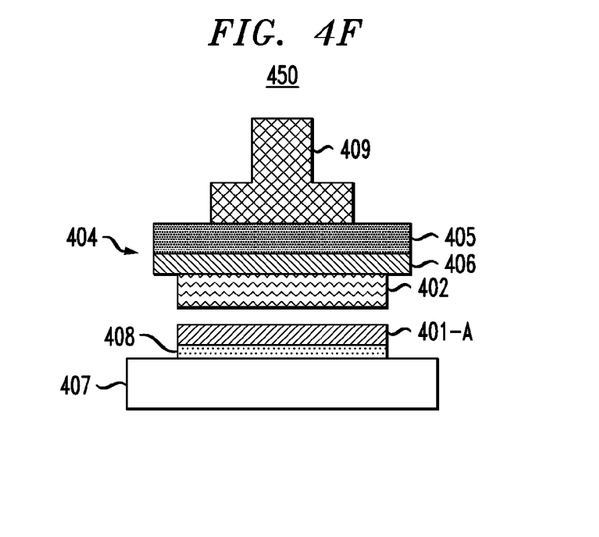
FIG. 4F illustrates a cross-sectional view of a structure after removal of a vaporizable release layer, according to an embodiment of the invention.

FIG. 4A illustrates a structure 400 comprising a base substrate 401. In FIG. 4B, a structure 410 comprises a vaporizable release layer 403 deposited onto the top surface of the base substrate 401, and a stressor layer 402 deposited onto the vaporizable release layer 403. In FIG. 4C, a structure 420 comprises the base substrate 401, the vaporizable release layer 403, the stressor layer 402 and a flexible support layer 404 comprising flexible support tape 405 and a tape adhesive 406 formed on top of the stressor layer 402. FIG. 4D illustrates a structure 430 wherein the base substrate 401 has been spalled leaving an upper spalled portion 401-A of the base substrate 401. The remaining lower portion of the base substrate 401 may be, for example, utilized for further spalling or may be recycled for further processing. The upper spalled portion 401-A remains attached to the vaporizable release layer 403, the stressor layer 402 and the flexible support layer 404. FIG. 4E illustrates a structure 440 wherein the upper spalled portion 401-A, along with the vaporizable release layer 403, the stressor layer 402 and the flexible support layer 404, has been transferred to a handle substrate 407. An epoxy layer 408 is provided between the bottom surface of the upper spalled portion 401-A and the top surface of the handle substrate 407 in order to attach the upper spalled portion 401-A to the handle substrate 407, utilizing heated laminating force 409. Then, a simple thermal process is utilized to raise the temperature of the structure 440 to 200-300 degrees Celsius resulting in a structure 450 shown in FIG. 4F, whereupon the vaporizable release layer 403 has been vaporized releasing the stressor layer 402 from the upper spalled portion 401-A. In this configuration, no further etching is necessary.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:
1. A method, comprising:
providing a base substrate;
depositing a stressor layer and a vaporizable release layer on the base substrate;
forming a flexible support layer on at least one of the stressor layer and the vaporizable release layer;
spalling an upper portion of the base substrate;
securing the spalled upper portion of the base substrate to a handle substrate; and
vaporizing the vaporizable release layer to release at least the flexible support layer from a remaining structure comprising the spalled upper portion of the base substrate secured to the handle substrate;
wherein vaporizing the vaporizable release layer comprises applying heat to the vaporizable release layer to substantially or completely vaporize the vaporizable release layer such that the flexible support layer is physically released from said remaining structure as a direct result of the substantial or complete vaporization of the vaporizable release layer.

2. The method of claim 1, wherein the vaporizable release layer is positioned between the stressor layer and the flexible support layer.

3. The method of claim 1, wherein the vaporizable release layer is positioned between the stressor layer and the base substrate.

4. The method of claim 1, further comprising:
forming a patterned vaporizable release layer on the base substrate, which comprises an opening that exposes a portion of the base substrate;
forming the stressor layer on the patterned vaporizable release layer and in contact with the onion of the base substrate exposed through the opening of the patterned vaporizable release layer; and applying heat to the patterned vaporizable release layer to debond portions of the stressor layer which overlap the patterned vaporizable release layer to thereby define edges of the stressor layer.

5. The method of claim 1, wherein the flexible support layer comprises at least one of a flexible support tape and a tape adhesive.

6. The method of claim 1, wherein the vaporizable release layer is applied via a standard spin coat process.

7. The method of claim 1, wherein said remaining structure comprises the stressor layer and wherein the method further comprises removing the stressor layer from the spalled upper portion of the base substrate secured to the handle substrate, following the vaporizing of the vaporizable release layer.

8. An apparatus, comprising:
   a handle substrate;
   a spalled upper portion of a base substrate, wherein the spalled upper portion of the base substrate is bonded to the handle substrate;
   a stressor layer and a vaporizable release layer forming a stacked structure that is coupled to the spalled upper portion of the base substrate;
   a flexible support layer formed on at least one of the stressor layer and the vaporizable release layer;
   wherein the vaporizable release layer is configured to release at least the flexible support layer from a remaining structure comprising the spalled upper portion of the base substrate secured to the handle substrate upon the application of heat to the vaporizable release layer to substantially or completely vaporize the vaporizable release layer such that the flexible support layer is physically released from said remaining structure as a direct result of the substantial or complete vaporization of the vaporizable release layer.

9. The apparatus of claim 8, wherein the vaporizable release layer is positioned between the stressor layer and the flexible support layer.

10. The apparatus of claim 8, wherein the vaporizable release layer is positioned between the stressor layer and the spalled upper portion of the base substrate.

11. The apparatus of claim 8, wherein the stacked structure comprises a patterned vaporizable release layer that is disposed on the spalled upper portion of the base substrate, wherein the patterned vaporizable release layer is patterned to define edges of the stressor layer.

12. The apparatus of claim 8, wherein the flexible support layer comprises at least one of a flexible support tape and a tape adhesive.

13. The apparatus of claim 12, wherein the vaporizable release layer is pre-coated onto the flexible support layer.

14. The apparatus of claim 8, wherein the vaporizable release layer is applied via a standard spin coat process.

15. A method for spalling a base substrate, comprising:
   providing the base substrate;
   depositing a vaporizable release layer on the base substrate;
   depositing a stressor layer on the vaporizable release layer;
   forming a flexible support layer on the stressor layer;
   spalling an upper portion of the base substrate;
   securing the spalled upper portion of the base substrate to a handle substrate; and
   vaporizing the vaporizable release layer to release the flexible support layer and the stressor layer from the spalled upper portion of the base substrate secured to the handle substrate;
   wherein vaporizing the vaporizable release layer comprises applying heat to the vaporizable release layer to substantially or completely vaporize the vaporizable release layer such that the flexible support layer and stressor layer are physically released from the spalled upper portion of the base substrate as a direct result of the substantial or complete vaporization of the vaporizable release layer.

16. The method of claim 15, wherein the flexible support layer comprises at least one of a flexible support tape and a tape adhesive.

17. The method of claim 15, wherein the vaporizable release layer is applied via a standard spin coat process.

* * * * *